United States Patent
Chen

(10) Patent No.: US 7,290,751 B2
(45) Date of Patent: Nov. 6, 2007

(54) COMPOSITE MOLD AND METHOD FOR MANUFACTURING THE SAME

(75) Inventor: Ga-Lane Chen, Fremont, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/439,936

(22) Filed: May 24, 2006

(65) Prior Publication Data
US 2006/0289293 A1    Dec. 28, 2006

(30) Foreign Application Priority Data
Jun. 24, 2005   (CN)   .................. 2005 1 0035543

(51) Int. Cl.
*C23C 14/32* (2006.01)
(52) U.S. Cl. ................ 249/114.1; 427/249.7; 427/135
(58) Field of Classification Search .......... 427/249.7, 427/135, 133; 249/134, 115, 114.1, 155
See application file for complete search history.

(56) References Cited

U.S. PATENT DOCUMENTS

| | | | | |
|---|---|---|---|---|
| 5,112,025 A | * | 5/1992 | Nakayama et al. | ......... 249/115 |
| 5,380,349 A | * | 1/1995 | Taniguchi et al. | ............ 65/286 |
| 5,827,613 A | * | 10/1998 | Nakayama et al. | ......... 428/408 |
| 6,770,337 B2 | * | 8/2004 | Debe et al. | ................ 428/32.6 |
| 7,025,584 B2 | | 4/2006 | Tsau | |
| 7,033,649 B2 | * | 4/2006 | Veerasamy | .................. 427/553 |
| 2005/0173834 A1 | * | 8/2005 | Lucek et al. | ................ 264/319 |
| 2006/0026995 A1 | * | 2/2006 | Wang | ...................... 65/374.13 |
| 2006/0179887 A1 | * | 8/2006 | Lung et al. | ............. 65/374.12 |

FOREIGN PATENT DOCUMENTS

JP      2002348129 A   * 12/2002

OTHER PUBLICATIONS

U.S. Appl. No. 11/309,563, filed Aug. 23, 2006.*

* cited by examiner

*Primary Examiner*—Robert Davis
*Assistant Examiner*—Marissa W. Chaet
(74) *Attorney, Agent, or Firm*—Jeffrey T. Knapp

(57) ABSTRACT

A composite mold comprising a main body, a molding layer formed on the main body, and a protective layer formed on the molding layer, the protective layer being made from diamond-like carbon. A method for manufacturing the composite mold comprising the following steps: providing a main body; forming a molding layer on the main body; and forming a protective layer on the molding layer, the protective layer being comprised of diamond-like carbon.

12 Claims, 3 Drawing Sheets

COMPOSITE MOLD AND METHOD FOR MANUFACTURING THE SAME

TECHNICAL FIELD

The present invention relates to molds, and more specifically to composite molds and a method for manufacturing the same.

BACKGROUND

Outer or inner components of customer electronic products, such as mobile phones, digital cameras, liquid crystal displays, DVD players, etc are generally made by either an injection-molding process or a direct press-molding process using a mold. The components obtained by the direct press-molding method do not need to undergo further processing, such as a polishing process and accordingly, the manufacturing efficiency can be greatly increased. However, the mold used in the injection-molding method or the direct press-molding method has to satisfy certain critical requirements such as high chemical stability, resistance to heat shock, good mechanical strength, and good surface smoothness.

Several criteria that should be considered in choosing the material for making the mold are listed below:
   a. the mold formed from such material is rigid and hard enough so that the mold cannot be damaged by scratching and can withstand high temperatures;
   b. the mold formed from such material is highly resistant to deformation or cracking even after repeated heat shock;
   c. the mold formed from such material does not react with or adhere to the glass material at high temperatures;
   d. the material is highly resistant to oxidization at high temperatures;
   e. the mold formed of such material has good machinability, high precision, and a smooth molding surface; and
   f. the manufacturing process using the mold is cost-effective.

Referring to FIG 4, a typical mold 10 usually consists of a substrate 12 and a protective layer 14 formed on the substrate 12. Normally, microstructures are formed on the protective layer 14, according to a surface shape of products to be formed. The protective layer 14 is made from nickel-containing materials, which is used to directly contact with raw workpieces. The protective layer 14 can be made of a nickel phosphorus alloy. The substrate 12 can be made from stainless steel.

However, such mold will be typically used many thousands of times, after a period of usage the protective layer 14 is prone to cracking or even peeling off according to stress concentration at places where microstructures are present. Thus, a surface of the protective layer 14 will be destroyed and precision of the microstructures will decrease. Therefore, the quality of the glass products made by such mold is decreased, and the service lifetime of such mold will be shortened.

Therefore, a heretofore-unaddressed need exists in the industry to address the aforementioned deficiencies and inadequacies.

SUMMARY

A preferred embodiment of a composite mold includes a main body, a molding layer formed on the main body, and a protective layer formed on the molding layer. The protective layer is made of diamond-like carbon.

A preferred embodiment of a method for manufacturing the composite mold includes the following steps: providing a main body; forming a molding layer on the main body; and forming a protective layer on the molding layer, the protective layer being comprised of diamond-like carbon.

Other advantages and novel features will become more apparent from the following detailed description when taken in conjunction with the accompanying drawings, in which:

BRIEF DESCRIPTION OF THE DRAWINGS

Many aspects of a composite mold and method for manufacturing the same can be better understood with reference to the following drawings. The components in the drawings are not necessarily drawn to scale, the emphasis instead being placed upon clearly illustrating the principles of the present mold. Moreover, in the drawings, like reference numerals designate corresponding parts throughout the two views.

DETAILED DESCRIPTION OF THE EMBODIMENTS

Figure 1:
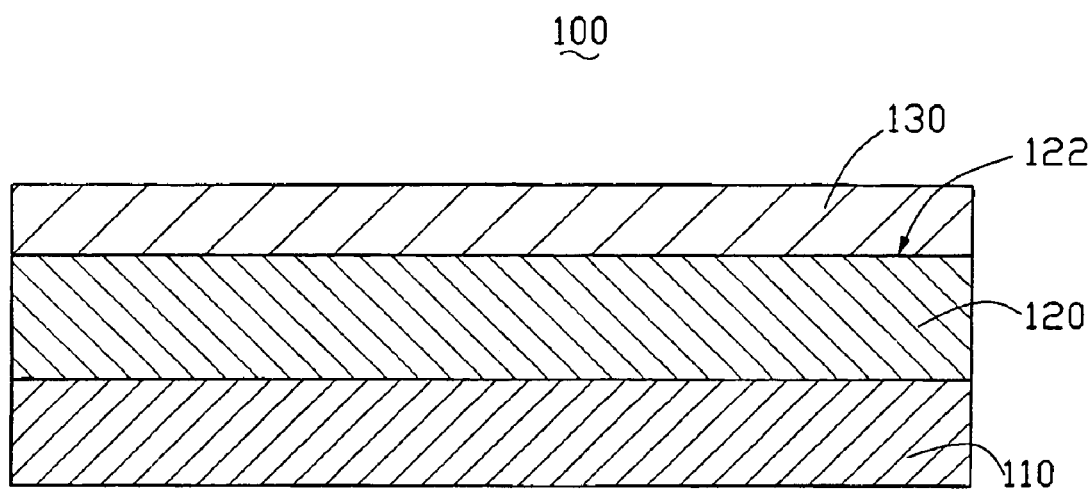
FIG. 1 is a schematic, cross-sectional view of a composite mold in accordance with a preferred embodiment.

Referring to FIG. 1, a composite mold 100 of the preferred embodiment comprises a main body 110, a protective layer 130, and a molding layer 120 sandwiched therebetween. The molding layer 120 has a thickness in the range from 50 micrometers to 2 millimeters, and preferably from 100 to 500 micrometers. The protective layer 130 has a thickness in the range from 5 to 50 nanometers, and preferably 10 to 30 nanometers.

The molding layer 120 can be made from nickel phosphorus alloy. The molding layer 120 has a surface 122 adjacent to the protective layer 130. Microstructures are formed extending from the surface 122 to fit a surface shape of a workpiece to be manufactured as required. The microstructures can be any needed shape, such as V-shaped, round, ladder-shaped, column-shaped, etc.

Since the nickel phosphorus alloy itself is porous, in order to protect the main body 110 from corrosion, the main body 110 should preferably be made from a stainless steel, such as Ramax, Corrax or Stavax steel provided by ASSAB Medicin AB (Sundbyberg, Sweden), preferably Stavax steel, which has high purity and good anti-corrosion properties.

The protective layer 130 contacts with the workpiece to be manufactured. The protective layer 130 is made from diamond-like carbon (DLC). Diamond-like carbon has many desirable physical and chemical properties, such as: high rigidity (>15 GPa), corrosion resistance, high surface smoothness, low friction coefficient, high density, perfect electric insulation, good heat conduction and wear resistance properties, etc. Thus the protective layer 130 can provide high rigidity, wear resistance and impact-resistance properties. Accordingly, surface structure of the composite mold 100 can not easily be destroyed during molding. The protective layer 130 should have a thickness in the range from roughly 5 to about 50 nanometers, and preferably be in the range from 10 to 30 nanometers.

Generally, an allotrope of carbon or its ramifications containing a mixture of $sp^2$ and $sp^3$ bonds, where $sp^3$ bond content is proportionally higher, and still maintaining properties similar to that of diamond, are called diamond-like carbon. The diamond-like carbon can be separated into two types: one being amorphous diamond-like carbon (abbreviated to a-C), wherein hydrogen atoms make up less than 1 percent of the total; the other being amorphous hydrogenated diamond-like carbon (abbreviated to a-C:H), where hydrogen atoms make up a percentage in the range from 20 to 60 of the total number of atoms, and where other atoms or groups may also be included, such as nitrogen atoms and nitryl groups.

The protective layer 130 can be made of amorphous hydrogenated carbon, where hydrogen atoms make up a percentage in the range from 5 to 20 percent of the total number of atoms, and more preferably 5 to 10 percent. It can also be made of amorphous nitrogenated and hydrogenated diamond-like carbon (abbreviated to a-C:N) where hydrogen makes up an atomic percent in the range from 3 to 20, and an atomic percent of nitrogen can be in the range from 5 to 10. Furthermore, it could also be made of amorphous nitrified and hydrogenated diamond-like carbon with an atomic percentage of hydrogen being in the range from 5 to 10, and an atomic percentage of nitrogen being in the range from 3 to 15.

A method of manufacturing the mold 100 comprises the following steps: providing a main body 110 made of stainless steel, forming a molding layer 120 on the main body 110 made of nickel phosphorus alloy, and forming a protective layer 130 on the molding layer 120 made of diamond-like carbon. When microstructures are needed for the workpiece, microstructures should be formed at the molding layer 120 after the molding layer 120 is formed, and a cleaning step should preferably be carried out thereafter. Correspondingly, the protective layer 130 also forms microstructures which have the same shape as that of the molding layer 120.

The molding layer 120 can be formed using a chemical plating method. The protective layer 130 can be formed using a sputter deposition method, such as direct current sputtering, reactive alternating current sputtering or a reactive radio frequency method. A mixture of inert gas, such as argon or krypton, and a reactive gas, such as methane, ethane, ethyne, or hydrogen-nitrogen containing gas should preferably be introduced into the sputtering process.

Figure 2:
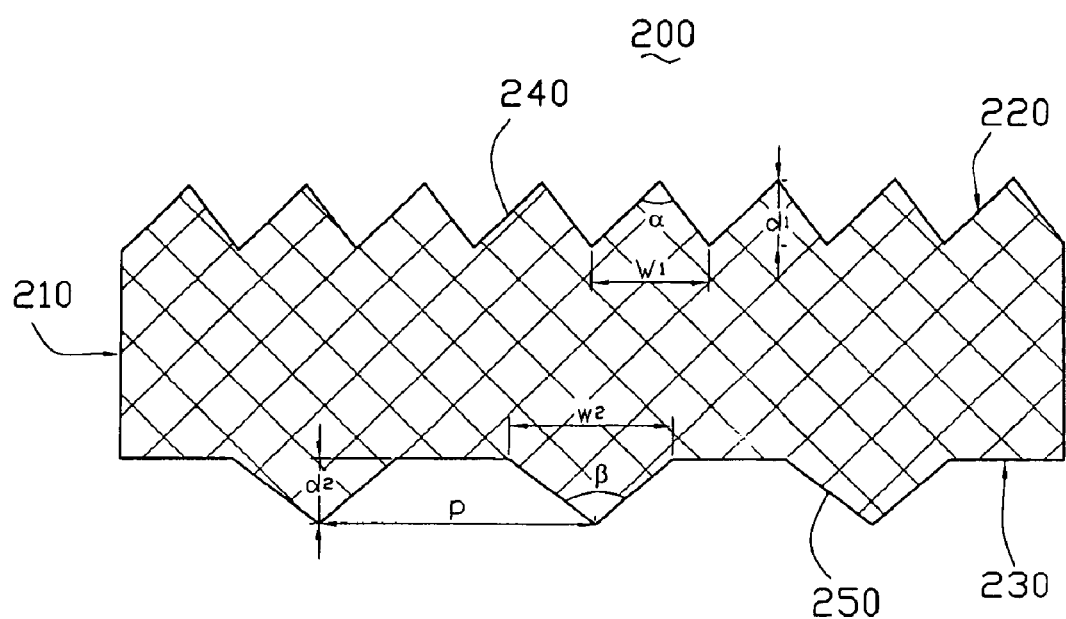
FIG. 2 is a schematic, cross-sectional view of a light guide plate to be manufactured by the composite mold of the present invention.

The mold 100 can be used to manufacture all kinds of components for electrical products made by an injection-molding processes or a direct press-molding processes using a mold. One of applications of the mold 100 is illustrated in embodiments as below:

Referring to FIG. 2, a light guide plate 200 to be manufactured using the mold of the present invention comprises a light incident surface 210, a light emitting surface 220 and a bottom surface 230. A plurality of first microstructures 240 are formed extending from the light emitting surface 220, each microstructure 240 is connected to its neighboring microstructures 240. A plurality of second microstructures 250 are formed extending from the bottom surface 230, spaced from each other. The first and the second microstructures 240, 250 are V-shaped protrusions. A width (labeled as "w1") of the V shaped protrusion of the first microstructure 240 is in the range from 10 to 40 millimeters, preferable 10 to 20 millimeters. An angle of the V shaped protrusion, labeled as "α", is in the range from 80 to 130 degrees. A depth (labeled as "d1") thereof is in the range from 1 to 8 millimeters. A width (labeled as "w2") of the V shaped protrusion of the second microstructure 250 is in the range from 10 to 20 millimeters, an angle (labeled as "β") thereof is in the range from 70 to 150 degrees, a depth thereof (labeled as "d2") is in the range from 1 to 8 millimeters, and a pitch thereof (labeled as "p") is in the range from 10 to 80 millimeters.

Figure 3A:
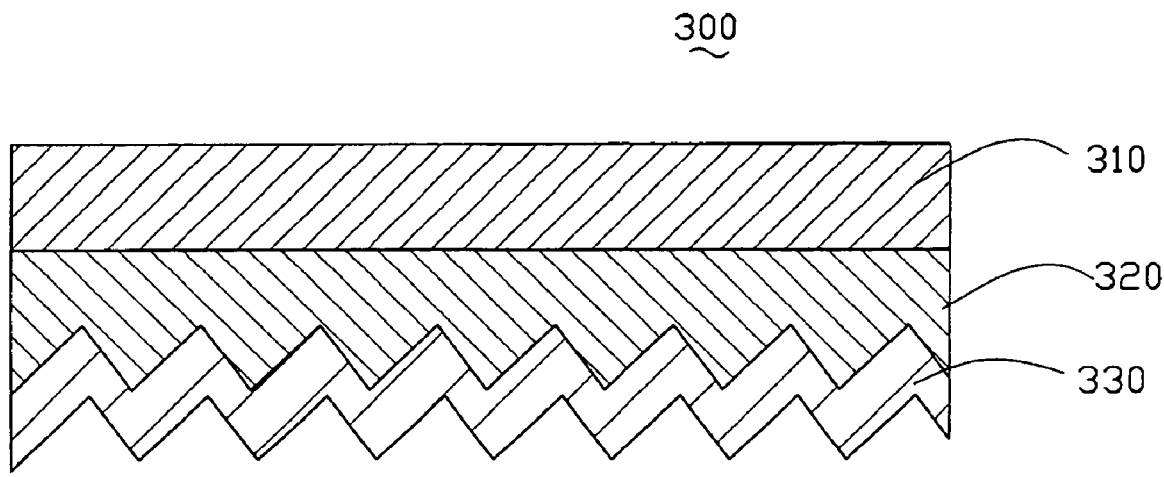
FIGS. 3A~3B are schematic, cross-sectional views of a composite mold used for manufacturing the light guide plate of FIG. 2.
Figure 3B:
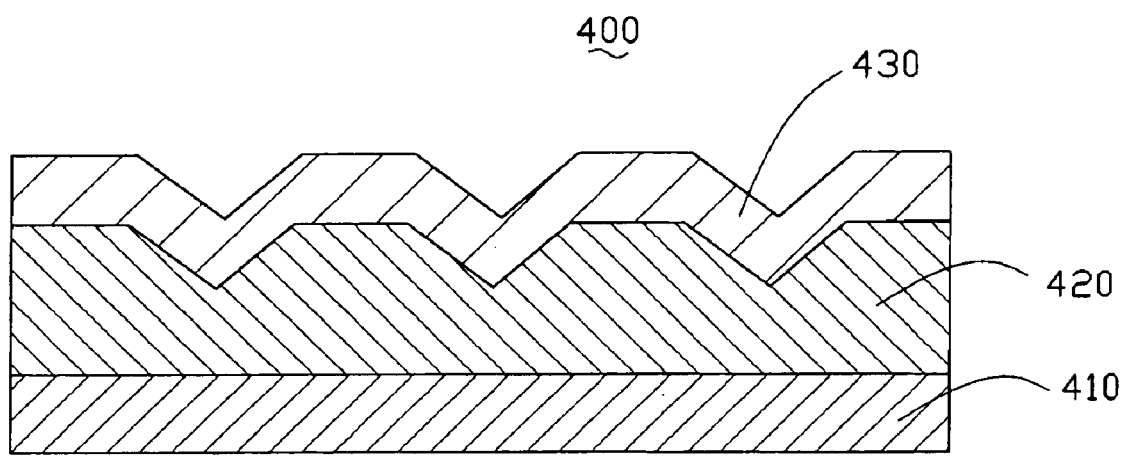
Figure 4:
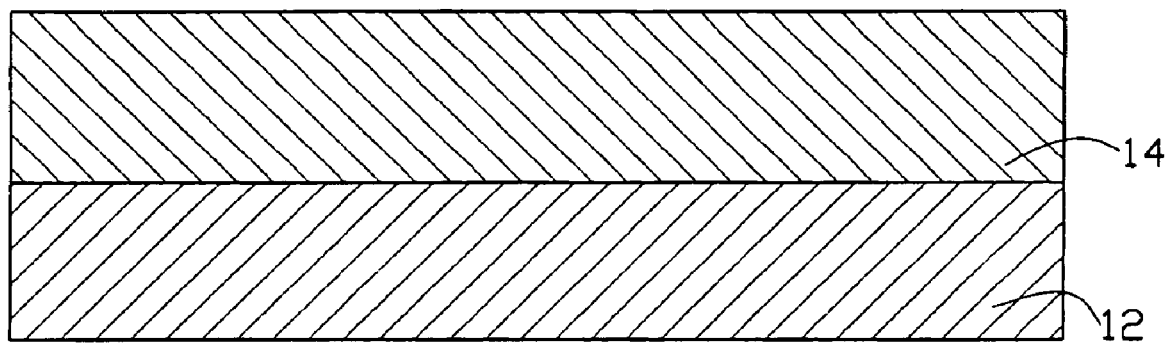
FIG. 4 is a schematic, cross-sectional view of a typical mold.

Referring to FIGS. 3A~3B, a mold to manufacture the light guide plate 200 of FIG. 2 is provided. The mold includes an upper mold 300 and a bottom mold 400, the upper mold 300 is used to manufacture the first microstructures of the light emitting surface 220, the bottom mold 400 is used to manufacture the second microstructures of the bottom surface 230 of the light guide plate 200.

The upper mold 300 includes a main body 310, a molding layer 320 and a protective layer 330 stacked in turn. The molding layer 320 includes a plurality of V shaped protrusions according to the first microstructures 240 of the light guide plate 200. The protective layer 330 has a shape matching that of the microstructure 240. The protective layer 330 can be made from diamond-like carbon, with a thickness in the range from 5 to 50 nanometers, and preferably in the range 10 to 30 nanometers. The molding layer 320 can be made from nickel phosphorus alloy. The main body 310 can be made from stainless steel.

The bottom mold 400 includes a main body 410, a molding layer 420 formed on the main body 410, and a protective layer 430 formed on the molding layer 420. V shaped protrusions corresponding to the second microstructures 250 of the light guide plate 200 are formed extending from a surface of the molding layer 420, adjacent to the protective layer 430. The protective layer 430 has same shape of microstructures 250 as that of the molding layer 420. The protective layer 430 can be made from diamond-like carbon. The protective layer 430 has a thickness in the range from 5 to 50 nanometers, and preferably from 10 to 30 nanometers. The molding layer 420 can be made from nickel phosphorus alloy The main body 410 can be made from stainless steel.

Compared with the conventional mold and method for manufacturing the mold, the above-described molds employ a protective layer with made of diamond-like carbon on the main body, since the diamond-like carbon consists of a mixture of $sp^2$ and $sp^3$ bonds, and has desirable physical and chemical properties, such as: high rigidity (>15 GPa), good corrosion resistance, high surface smoothness, low friction coefficient, high density, perfect electric insulation, good heat conduction and wear resistance, etc. Thus the protective layer can provide high rigidity, wear resistance and impact-resistance. Accordingly, surface structure of the mold cannot easily be destroyed during molding.

The mold and method for manufacturing the mold can be used to manufacture all kinds of products which can be made by press molding or injection molding method.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

I claim:
1. A composite mold comprising:
   a main body,
   a molding layer formed on the main body, the molding layer being made of a nickel phosphorus alloy, and a protective layer formed on and in contact with the molding layer, the protective layer being made of diamond-like carbon.

2. The composite mold in accordance with claim 1, wherein the diamond-like carbon is an amorphous hydrogenated diamond-like carbon with an atomic percentage of hydrogen in the range from 5 to 20.

3. The composite mold in accordance with claim 1, wherein the diamond-like carbon is amorphous nitrogenated and hydrogenated diamond-like carbon with an atomic percentage of hydrogen in the range from 3 to 20, and an atomic percentage of nitrogen in the range from 5 to 10.

4. The composite mold in accordance with claim 1, wherein the diamond-like carbon is amorphous nitrified and hydrogenated diamond-like carbon, wherein an atomic percent of hydrogen in the range from 5 to 10, and an atomic percentage of nitrogen in the range from 3 to 15.

5. The composite mold in accordance with claim 1, wherein a thickness of the protective layer is in the range from 5 to 50 nanometers.

6. The composite mold in accordance with claim 1, wherein the molding layer has a thickness in the range from 5 micrometers to 2 millimeters.

7. The composite mold in accordance with claim 1, wherein the molding layer having a plurality of microstructures formed on and extending from a surface thereof facing the protective layer.

8. The composite mold in accordance with claim 1, wherein the main body is made from stainless steel.

9. A method for manufacturing a composite mold, comprising the following steps:
   providing a main body;
   forming a molding layer on the main body, the molding layer being made of a nickel phosphorus alloy; and
   forming a protective layer on and in contact with the molding layer, the protective layer being comprised of diamond-like carbon.

10. The method in accordance with claim 9, further comprising a step of forming a plurality of microstructures on a surface of the molding layer.

11. The method in accordance with claim 9, wherein the molding layer is formed by a chemical plating method.

12. The method in accordance with claim 9, wherein the protective layer is formed by a method selected from the group consisting of reactive direct current sputtering, reactive alternating current sputtering and a reactive radio frequency method.

* * * * *